United States Patent [19]

Miyasaka

[11] Patent Number: 5,500,619
[45] Date of Patent: Mar. 19, 1996

[54] SEMICONDUCTOR DEVICE

[75] Inventor: Tadashi Miyasaka, Kawasaki, Japan

[73] Assignee: Fuji Electric Co., Ltd., Kanagawa, Japan

[21] Appl. No.: 121,470

[22] Filed: Sep. 16, 1993

Related U.S. Application Data

[63] Continuation-in-part of Ser. No. 33,779, Mar. 17, 1993.

[30] Foreign Application Priority Data

| Mar. 18, 1992 | [JP] | Japan | 4-62254 |
| Mar. 24, 1992 | [JP] | Japan | 4-65960 |
| May 19, 1992 | [JP] | Japan | 4-125214 |
| Mar. 10, 1993 | [JP] | Japan | 5-048435 |

[51] Int. Cl.$^6$ ................................ H03K 17/687
[52] U.S. Cl. .................. 327/427; 327/434; 327/480
[58] Field of Search ............... 307/570, 575, 307/577, 584, 583, 574, 581, 299.2, 491, 495, 499, 350, 303; 327/427, 432–437, 479, 480, 204, 577

[56] References Cited

U.S. PATENT DOCUMENTS

| 4,603,269 | 7/1986 | Hochstein | 307/571 |
| 4,680,490 | 7/1987 | Baker et al. | 307/575 |
| 4,746,813 | 5/1988 | Disser | 307/570 |
| 4,774,624 | 9/1988 | Qualich | 361/159 |
| 4,775,801 | 10/1988 | Baum | 307/141 |
| 4,890,009 | 12/1989 | Miyazaki et al. | 307/270 |
| 5,055,721 | 10/1991 | Majumdar et al. | 307/592 |
| 5,084,668 | 1/1992 | Kotowski et al. | 329/280 |
| 5,091,664 | 2/1992 | Furuhata | 307/575 |
| 5,115,188 | 5/1992 | Norton | 323/365 |
| 5,121,036 | 6/1992 | Fuji | 307/303 |
| 5,172,018 | 12/1992 | Colandrea et al. | 307/571 |
| 5,272,392 | 12/1993 | Wong et al. | 307/299.2 |
| 5,374,857 | 12/1994 | Carobolante | 327/110 |

FOREIGN PATENT DOCUMENTS

| 0206505 | 12/1986 | European Pat. Off. . |
| 0252541 | 1/1988 | European Pat. Off. . |
| 0361211 | 4/1990 | European Pat. Off. . |
| 0425035 | 5/1991 | European Pat. Off. . |
| 0467681 | 1/1992 | European Pat. Off. . |
| 3826284 | 2/1990 | Germany . |
| 2-666712 | 10/1990 | Japan . |

OTHER PUBLICATIONS

"Use of the Same MCU I/O Line to Drive a Powr MOSFET and to Detect Overload", Motorola, Inc., Technical Developments, vol. 16, 1992, pp. 85–86.
Patent Abstracts of Japan, vol. 15, No. 18, Jan. 16, 1991, vol. 015018.

*Primary Examiner*—Toan Tran
*Attorney, Agent, or Firm*—Finnegan, Henderson, Farabow, Garrett & Dunner

[57] ABSTRACT

A semiconductor device includes a main insulated gate type switching element having a gate electrode and controllable by a gate voltage applied to the gate electrode, a current detecting insulated gate type switching element connected in parallel to the main insulated gate type switching element, a detecting resistor for detecting a current flowing in the current detecting insulated gate type switching element, a gate controlling element capable of controlling the gate voltage by a drop voltage in the detecting resistor, and a gate control relieving element for relieving a varying speed of the gate voltage varied based on an operation of the gate controlling element.

15 Claims, 6 Drawing Sheets

SEMICONDUCTOR DEVICE

This application is a continuation-in-part of U.S. patent application Ser. No. 08/033,779 filed Mar. 17, 1993 in the names of Shogo OGAWA, Tadashi MIYASAKA, Shinichi KOBAYASHI, and Kesanobu KUWABARA.

BACKGROUND OF THE INVENTION

The present invention relates to a structure of a protective circuit for use in a semiconductor device and, in particular, to an overcurrent protective circuit to protect a switching element in a semiconductor device using an insulated gate type semiconductor switching element such as an IGBT from an overcurrent.

Figure 12:
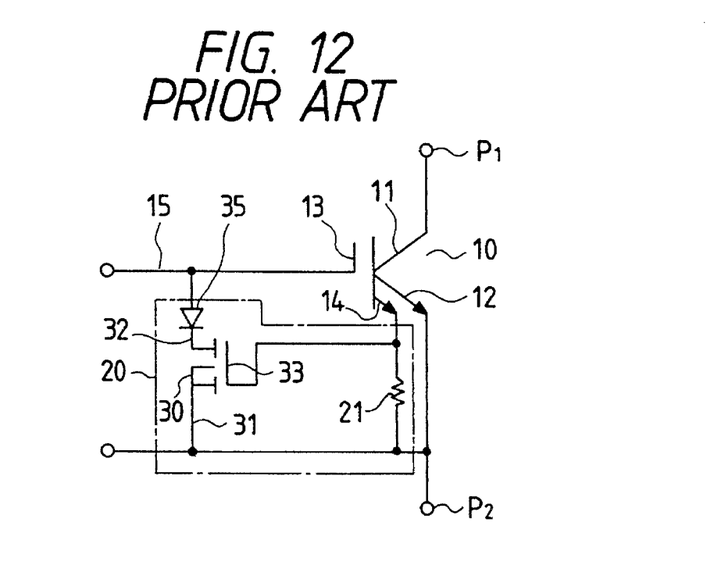
FIG. 12 is a circuit diagram showing a structure of a conventional semiconductor device.
Figure 13:
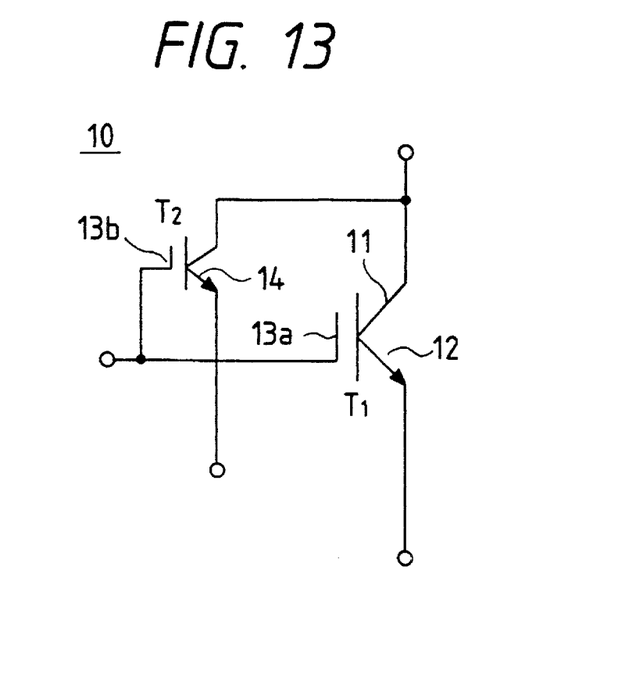
FIG. 13 is a circuit diagram of an equivalent circuit of an IGBT with a current sensing emitter which is employed in the conventional semiconductor device shown in FIG. 12; and, FIG. 14 is a graphical representation to explain an operation of the conventional semiconductor device shown in FIG. 12.

FIG. 12 shows a circuit diagram of a conventional semiconductor device which includes an overcurrent protective circuit. The conventional semiconductor device includes an insulated gate type bipolar transistor (which will be abbreviated as IGBT) 10 as a switching element and a current limit circuit 20. The IGBT 10 is a power semiconductor device which is able to control a large current under a high voltage. In the semiconductor device, an external terminal P1, which provides a high potential, is connected to a collector 11 of the IGBT 10, and an external terminal P2, which provides a low potential, is connected to an emitter 12 of the IGBT 10. And, by controlling a gate potential Vg to be applied to a gate electrode 13 of the IGBT 10, the current of a load circuit to be connected to the external terminals P1 and P2 can be controlled. Further, the IGBT 10 includes a sensing emitter 14 which is used to sense or detect a current, in addition to the emitter 12 to be connected to the external terminal P2. That is, the IGBT 10, as shown in FIG. 13 in terms of an equivalent circuit, includes a main insulated gate type switching element (main IGBT) $T_1$ and a current-detecting insulated gate type switching element (sub IGBT) $T_2$ connected in parrell to the main IGBT. The emitter of the current-detecting insulated gate type switching element $T_2$ is the sensing emitter 14. The gate electrode 13 comprises a gate electrode 13a of the main insulated gate type switching element $T_1$ and a gate electrode 13b of the current-detecting insulated gate type switching element $T_2$. The sensing emitter 14 is connected to the external terminal P2 through a current sensing resistor 21. For this reason, from the sensing emitter 14, a current is allowed to flow out which is proportional to a current flowing between the collector 11 and emitter 12 of the main insulated gate type switching element $T_1$. The current limit circuit 20 comprises the current sensing resistor 21, a diode 35 for preventing an inverse current, and an n-channel MOSFET 30 connected through the inverse current preventive diode 35 to a gate line 15 to which a gate control signal is supplied by a gate drive circuit (not shown). The n-channel MOSFET 30 includes a source 31 which is connected to the external terminal P2 providing the low potential, a drain 32 which is connected through the inverse current preventive diode 35 to the gate line 15, and a gate 33 to which a drop voltage Vs in the current sensing resistor 21 is applied.

In the above-mentioned current limit circuit 20, if an overcurrent is caused to flow in the IGBT 10 due to shorts or the like and a given current flows from the sensing emitter 14 to the current sensing resistor 21, then the drop voltage in the current sensing resistor exceeds a threshold voltage of the MOSFET 30. As a result, the MOSFET 30 turns on, so that the current to be applied to the gate 13 of the IGBT 10 through the gate line 15 is caused to pass through the MOSFET 30, that is, the current is bypassed. Therefore, the gate potential Vg to be applied to the gate 13 decreases to thereby limit a collector current passing through the IGBT 10.

As mentioned above, the semiconductor device including the current limit circuit 20 is able to protect the main switching element from the overcurrent. However, in the conventional circuit, when executing current limit control in the main switching element, the current is lowered suddenly and sharply in order to protect the main switching element speedily.

Figure 14:
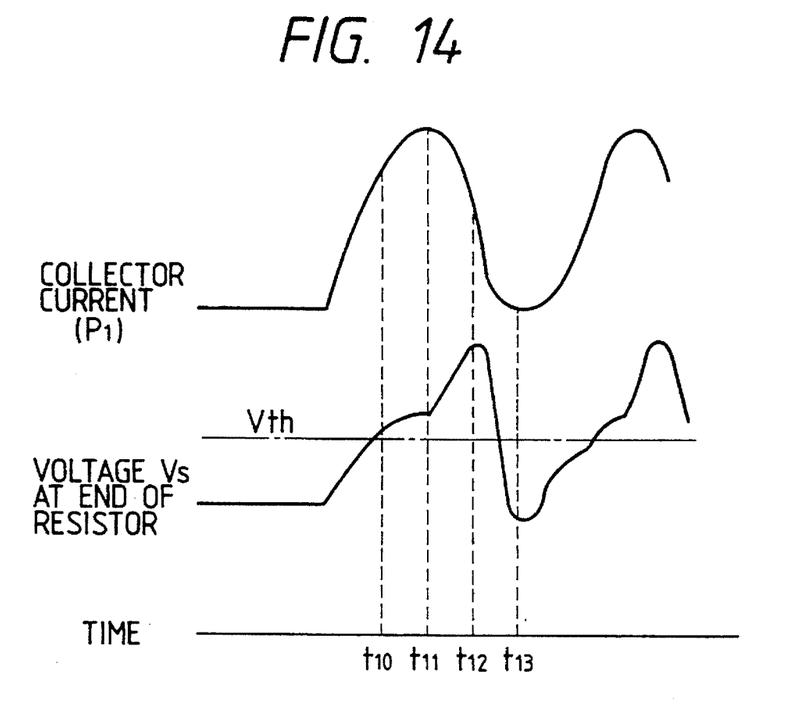

FIG. 14 shows the collector current flowing through the external terminal P1 and the drop voltage Vs occurring in the current sensing resistor 21 when the short of the load circuit or the like causes a large current to flow in a device using the current limit circuit shown in FIG. 12. At first, if the large current flows in the IGBT 10, then a current proportional to the large current flows from the sensing emitter 14 and the drop voltage Vs in the current sensing resistor 21 also rises. And, at a time $t_{10}$, if the drop voltage Vs exceeds the threshold voltage $V_{th}$ of the MOSFET 30, then the MOSFET 30 is allowed to conduct.

However, the collector current starts to decrease at a time $t_{11}$ when an overcurrent flows slightly due to delay in response in the operation of the MOSFET 30. At that time, especially in an element which controls a large current, due to the time differentiation (di/dt) of the suddenly lowering current and a wiring inductance L on the circuit etc., an induced voltage of L×di/dt, which is an inductance load voltage, occurs in the current sensing resistor 21. As a result of this, at a time $t_{12}$ as well, the MOSFET 30 is continuously biased forwardly by the induced voltage so that a voltage between the drain 32 and source 31 is lowering continuously. Therefore, the gate potential Vg applied to the IGBT 10 is further lowered to become under the threshold voltage of the IGBT 10 and thus, at a time $t_{13}$, the IGBT 10 is turned off. If the IGBT 10 is turned off once in this manner, although an overcurrent does not flow, not only the drop voltage Vs in the current sensing resistance 21 lowers down to zero but also the MOSFET 30 is turned off. Therefore, the gate potential Vg returns to a given potential which is supplied by the gate drive circuit, so that the IGBT 10 is turned on again to provide a condition which allows an overcurrent to flow. As mentioned above, in the conventional current limit circuit, especially when treating a large current, the opening and closing of the main switching element is repeated while the current is limited, which may cause the current value to oscillate.

SUMMARY OF THE INVENTION

Accordingly, in view of the above-mentioned problems found in the conventional semiconductor device, it is an object of the present invention to provide a semiconductor device which is able to protect a main switching element effectively from the influence of an inductance component of an overcurrent in a large current switching operation.

In achieving the above object, according to the present invention, there is provided a semiconductor device which relieves the response characteristic of the main switching element that starts to control a large current when it flows, thereby preventing the sudden variation of a main current flowing in the main switching element. In other words, according to the present invention, there is provided a semiconductor device which comprises a main insulated gate type switching element which can be controlled by a gate voltage to be applied to the gate electrode thereof, a current detecting insulated gate type switching element which is connected in parallel to the main insulated gate type switching element, a detecting resistor means detecting a current flowing in the current detecting insulated gate switching element, and a gate controlling element which is able to control the above gate voltage by means of a drop voltage in the detecting resistor means, characterized by further comprising a gate control relieving means for relieving the variation speed of the gate voltage due to the operation of the gate controlling element. The gate control relieving means may be a current limit means which is inserted just before the gate electrode or, alternatively, the gate controlling element may be an insulated gate type control element having an insulated gate and a current limit means may be inserted just before the gate electrode of the insulated gate type control element. Further, alternatively, the gate controlling element may be an insulated gate type control element having an insulated gate and a current absorb means may be inserted just before the gate electrode.

Still further, a current limit means or a current absorb means may be inserted just before the gate electrode of the current detecting insulated gate type switching element.

The present invention is also characterized in that the threshold voltage of the gate controlling element is set to be equal to or less than the saturation voltage of the main insulated gate type switching element.

The present invention is further characterized in that there is provided a commonly used and externally extracting terminal which is used to connect a terminal of the main insulated gate type switching element with a terminal of the detecting resistor means, and also that the terminal of the main insulated gate type switching element is connected with the externally extracting terminal by means of a first wiring, and the terminal of the detecting resistor means is connected with the externally extracting terminal by means of a second wiring.

As described above, by relieving the varying speed of the gate voltage to prevent the sudden variations of the main current in the current limiting operation of the insulated gate type switching element, it is possible to restrict the inductance load voltage which occurs due to the current sudden variations in the detecting resistor means. This prevents the gate controlling element from conducting suddenly, so that the gate voltage can be controlled to a level corresponding to a given current limit value by means of the gate controlling element.

In an insulated gate type switching element having an insulated gate or in an insulated gate type control element, the operation speed thereof can be controlled in accordance with the rate of rising of the gate voltage. Therefore, use of the current limit means makes it possible to reduce the rising rate of the gate voltage of the insulated gate type switching element and thus to relieve the response speed of the insulated gate type switching element itself.

Also, when the gate controlling element is an insulated gate type control element, then by using the current limit means or current absorbing means, the response speed of the insulated gate type control element can be relieved. For this reason, it is possible to restrict the variations in the gate voltage of the insulated gate type switching element which is controlled by the gate controlling element and thus to relieve the response speed of the insulated gate type switching element.

Of course, it is also possible to provide the current limit means and current absorb means in combination. Further, provision of such means make it possible to prevent a malfunction in which the semiconductor device is turned off due to instantaneous current variations and the like.

Also, by inserting the current limit means or current absorb means just before the gate electrode of the current detecting insulated gate type switching element, the response speeds of the main insulated gate type switching element and current detecting insulated gate type switching element can be equalized with each other. This can prevent the sudden current limit and also can prevent the destruction of the current detecting insulated gate type switching element itself.

Further, when the threshold voltage of the gate controlling element is set to be equal to or less than the saturation voltage of the main insulated gate type switching element, the induced voltage of the wiring inductance in the beginning of the load short allows the gate controlling element to operate effectively even if a voltage applied to the main insulated gate type switching element is low. As a result, the main switching element can be protected from an overcurrent.

Still further, when there is provided a commonly used and externally extracting terminal which is used to connect the terminal of the main insulated gate type switching element with the terminal of the detecting resistor means, the terminal of the main insulated gate type switching element is connected with the externally extracting terminal by a first wiring, and the terminal of the detecting resistor means is connected with the externally extracting terminal by a second wiring, then a wiring inductance due to the first wiring on the side of the main insulated gate type switching element is not included in a load circuit provided on the side of the current detecting insulated gate type switching element. This prevents the transient voltage of the detecting resistor means from varying suddenly, so that the current limit of the main insulated gate type switching element can be executed gently.

DETAILED DESCRIPTION OF THE INVENTION

Preferred embodiments of the present invention will now be described with reference to the accompanying drawings.

EMBODIMENT 1

Figure 1:
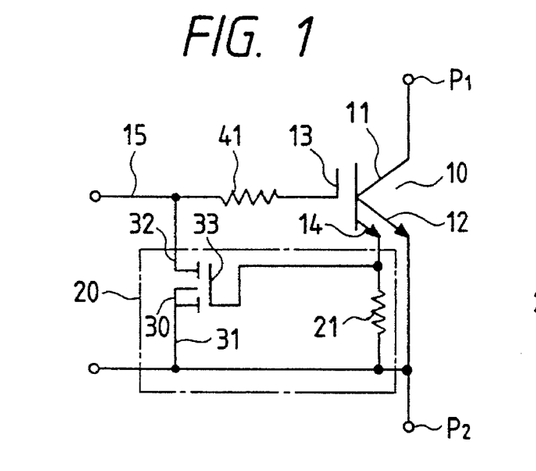
FIG. 1 is a circuit diagram showing a structure of a semiconductor device according to a first embodiment of the present invention.

FIG. 1 is a circuit diagram showing a structure of a semiconductor device including a current limit circuit 20 according to a first embodiment of the present invention invention. The device according to the first embodiment, similarly to the previously described conventional semiconductor device, is a power semiconductor device which uses as a main switching element an IGBT 10 having a current sensing emitter 14. The IGBT 10 of the present device has also an equivalent circuit shown in FIG. 13 and, in addition to an emitter 12, has the sensing emitter 14 which is used to detect a current. The sensing emitter 14 is connected through a current sensing resistor 21 to an external terminal P2 which provides a low potential. Also, the present semiconductor device is similar to the previously described conventional semiconductor device in that the current limit circuit 20 is driven by a voltage drop in the current sensing resistor 21 to limit an overcurrent which flows in the IGBT 10. Therefore, in FIG. 1, parts used in common with the conventional semiconductor device are given the same designations and the description thereof is omitted here.

What is worth notice in the present semiconductor device is that there is inserted to the gate electrode 13 of the IGBT 10 an easing or relieving resistor 41 which is used to relieve the variations of the gate voltage. The relieving resistor 41 is inserted just before the gate electrode 13 and is able to restrict the variation speed of the gate voltage to be applied to the gate electrode 13. That is, the IGBT is a voltage driven type element which is driven by a voltage to be applied to the insulated gate electrode 13, and the response speed of the IGBT can be controlled by means of a variation rate (dVg/dt) of the gate voltage Vg at the gate electrode 13. Therefore, by inserting the relieving resistor 41 to limit the current value to be transmitted to the gate electrode 13, a speed to charge and discharge the gate capacity of the gate electrode 13 can be relieved to thereby reduce the variation rate of the gate voltage Vg to be applied to the IGBT 10, so that the response speed of the IGBT 10 can be relieved.

Figure 2:
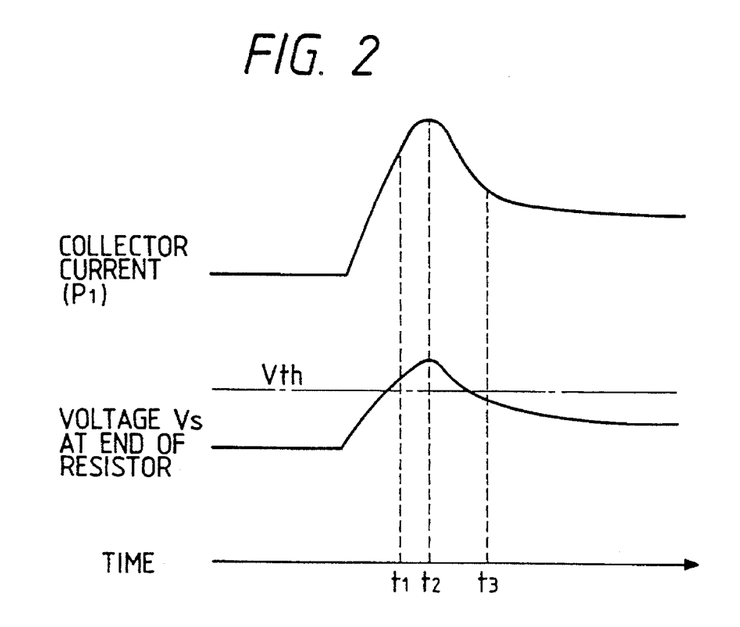
FIG. 2 is a graphical representation to explain an operation of the semiconductor device shown in FIG. 1.

FIG. 2 shows a collector current flowing through the external terminal P1 and a drop voltage Vs generated in the current sensing resistor 21 when a large current flows in the semiconductor device of the embodiment 1. Similarly to the conventional semiconductor device previously described, if a large current flows in the IGBT 10 due to a short or the like in a load circuit, then a current proportional to the large current is allowed to flow from the sensing emitter 14, and the drop voltage Vs in the current sensing resistor 21 is raised. If the drop voltage Vs exceeds the threshold voltage $V_{th}$ of the MOSFET 30 at the time $t_1$, then the MOSFET 30 is allowed to conduct. And, although the extraction of the electric charge of the gate capacity of the IGBT 10 is continued by the MOSFET 30, due to the interposition of the resistor 41 for current limitation, the amount of extraction of the electric charge is small and thus the response speed of the IGBT 10 can be relieved. The thus produced time lag prevents the collector current from decreasing rapidly. Thanks to this, the collector current that is controlled by the IGBT 10 is gradually decreased from the time $t_2$ and, with the decrease in the collector current, the drop voltage Vs is also reduced. And, at the time $t_3$, the amount of bypass of the MOSFET 30 to be driven in accordance with the drop voltage Vs is balanced with the amount of passing current of the IGBT 10 to be controlled by the bypassed gate voltage Vg, so that a current having the thus limited current value is allowed to flow in the IGBT 10. In this manner, in the semiconductor device having the current limit circuit according to the present embodiment, the response of the IGBT 10 can be delayed by means of the relieving resistor 41 inserted just before the gate electrode 13. This can relieve the current limiting operation in the IGBT 10 to thereby be able to restrict an inductance load voltage (L×di/dt) which is generated by the time differentiation (di/dt) of the varying collector current, which eliminates the possibility that the IGBT is turned off at the current limiting time. That is, the present semiconductor device can prevent the sudden drop or vibration of a current which is found in the conventional semiconductor device. Also, the prevention of the sudden current drop or the prevention of the vibration of the current value makes it possible, if necessary, to save the inverse current preventive diode 35 interposed between the gate line 15 and the MOSFET 30.

EMBODIMENT 2

Figure 3:
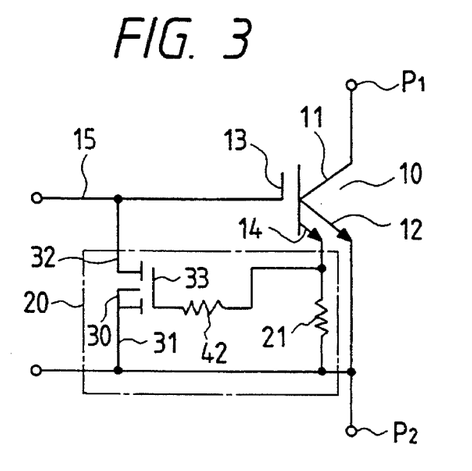
FIG. 3 is a circuit diagram showing a structure of a semiconductor device according to a second embodiment of the present invention.

FIG. 3 shows a circuit diagram of a structure of a semiconductor device including a current limit circuit 20 according to a second embodiment of the present invention. The semiconductor device according to the embodiment 2, similarly to the previously described semiconductor device, is a power semiconductor device using as a switching element an IGBT 10 which has a sensing emitter 14 for current detection. And, the present semiconductor device is similar to the previously described one also in that it includes a current limit circuit 20 which limits the passing current of the IGBT 10 through the sensing emitter 14 and a current sensing resistor 21. Accordingly, in the embodiment 2, parts used in common with the embodiment 1 are given the same designations and thus the description thereof is omitted here.

What is worth notice in the semiconductor device according to the embodiment 2 is that a resistor 42 is inserted in a circuit which applies a drop voltage Vs generated in the current sensing resistor 21 to a gate electrode 33 of a MOSFET 30. The resistor 42 is a resistor which is used to relieve the operation of the MOSFET 30. The resistor 42 reduces the speed at which the gate capacity of the gate electrode 33 of the MOSFET 30, a voltage driven type element similar to the IGBT, is charged and discharged, thereby being able to relieve the response speed of the MOSFET 30. This also relieves the varying speed of a gate potential Vg which is bypass-controlled by the MOSFET 30 so as to delay the response speed of the IGBT 10 as well. Therefore, similarly to the embodiment 1, the current limiting operation in the IGBT 10 is delayed to thereby restrict the generation of an inductance load voltage. Similarly to the embodiment 1, this eliminates the possibility that the MOSFET 30 is biased forwardly and, for this reason, there is no possibility that in the IGBT 10 the current can be reduced suddenly or the current value can be vibrated.

EMBODIMENT 3

Figure 4:
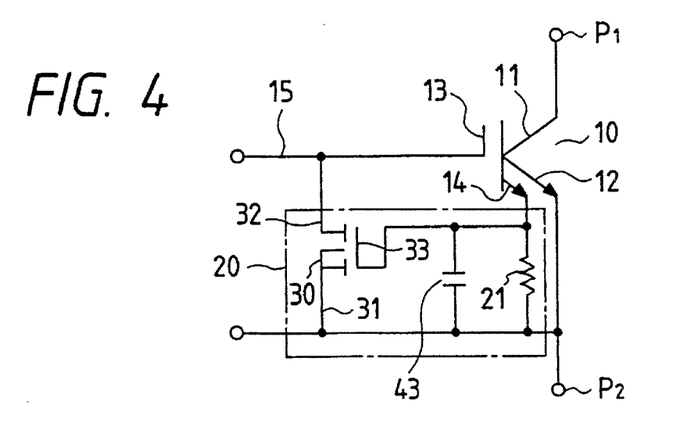
FIG. 4 is a circuit diagram showing a structure of a semiconductor device according to a third embodiment of the present invention.

FIG. 4 shows a circuit diagram of a structure of a semiconductor device according to a third embodiment of the present invention. The semiconductor device according to the embodiment 3, similarly to the previously described semiconductor device, includes a current limit circuit 20 and an IGBT 10 having a sensing emitter 14 for current detection. Therefore, the main structure and operation of the present semiconductor device are similar to those of the above-mentioned embodiment. And, parts used in common with the above-mentioned embodiment are given the same designations and thus the description thereof is omitted here.

What is worth notice in the embodiment 3 is that a capacitor 43 is connected in parallel to a current sensing resistor 21. The capacitor 43 is added in parallel to the gate capacity and, therefore, this is equivalent to the fact that an apparent gate capacity is increased. The capacitor 43 is a capacitor which is used to relieve the operation of the MOSFET 30. The capacitor 43 prolongs a time to charge a circuit extending to the gate electrode 33 of the MOSFET 30 through a drop voltage generated in the current sensing resistor 21, thereby delaying the response speed of the MOSFET 30. That is, use of the capacitor 43 reduces the speed to charge and discharge the gate electrode of the MOSFET 30 to thereby be able to relieve the response speed of the MOSFET 30. This in turn delays the response speed of the IGBT 10 whose gate electrode voltage Vg is controlled by the MOSFET 30 to prevent the sudden reduction of the current and the generation of the fluctuations of the current values, so as to be able to secure a stabled current limit operation.

EMBODIMENT 4

Figure 5:
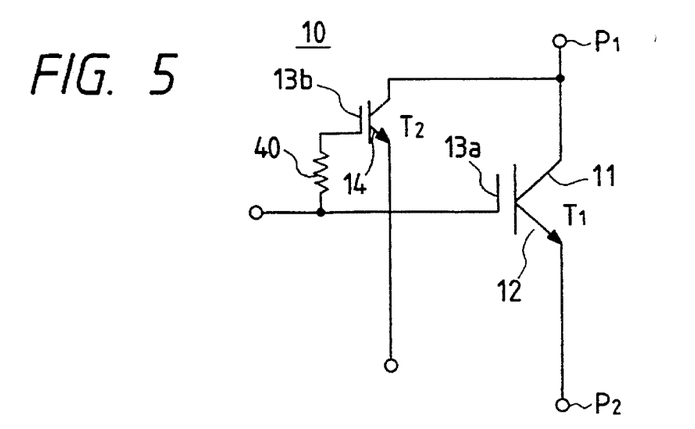
FIG. 5 is a circuit diagram showing a structure of a semiconductor device according to a fourth embodiment of the present invention.

FIG. 5 shows a circuit diagram of a structure of a semiconductor device according to a fourth embodiment of the present invention. According to the fourth embodiment, in an IGBT 10 with a current sensing emitter, a resistor 40 is inserted just before a gate electrode 13b of a current detecting insulated gate type switching element $T_2$. The gate electrode 13b of the current detecting insulated gate type switching element $T_2$ is much smaller in size than the gate electrode of a main insulated gate type switching element $T_1$ and, therefore, the gate capacity of the gate electrode 13b is also much smaller. As a result of this, if the gate voltage is applied to the two gate electrodes 13a and 13b, then the current detecting insulated gate type switching element $T_2$ having a smaller time constant turns on/off faster than the main insulated gate type switching element $T_1$ and thus has a faster responsive characteristic. This fast responsive characteristic may cause a current to center on the current detecting insulated gate type switching element $T_2$ transiently to thereby destroy the element itself. In view of this, in the present embodiment, in order to match the on/off speed of the current detecting insulated gate type switching element $T_2$ to that of the main insulated gate type switching element $T_1$, a resistor 40 is inserted just before the gate electrode 13b of the current detecting insulated gate type switching element $T_2$.

EMBODIMENT 5

Figure 6:
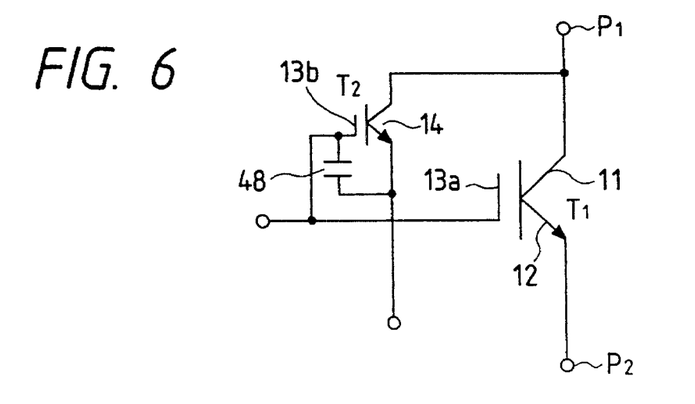
FIG. 6 is a circuit diagram showing a structure of a semiconductor device according to a fifth embodiment of the present invention.

FIG. 6 shows a circuit diagram of a structure of a semiconductor device according to a fifth embodiment of the present invention. In an IGBT 10 with a current sensing emitter according to the fifth embodiment, a capacitor 48 is inserted between a gate electrode 13b and an emitter 14 of a current detecting insulated gate type switching element $T_2$. That is, due to the fact that the capacitor 48 is inserted just before the gate electrode 13b, the gate capacity of the gate electrode 13b is increased apparently. Due to this, the on/off speed of the current detecting insulated gate type switching element $T_2$ can be matched to that of a main insulated gate type switching element $T_1$. As a result of this, similarly to the above-mentioned fourth embodiment, the current does not center on the current detecting insulated gate type switching element $T_2$ transiently to thereby prevent the element from being destroyed.

EMBODIMENT 6

Figure 7:
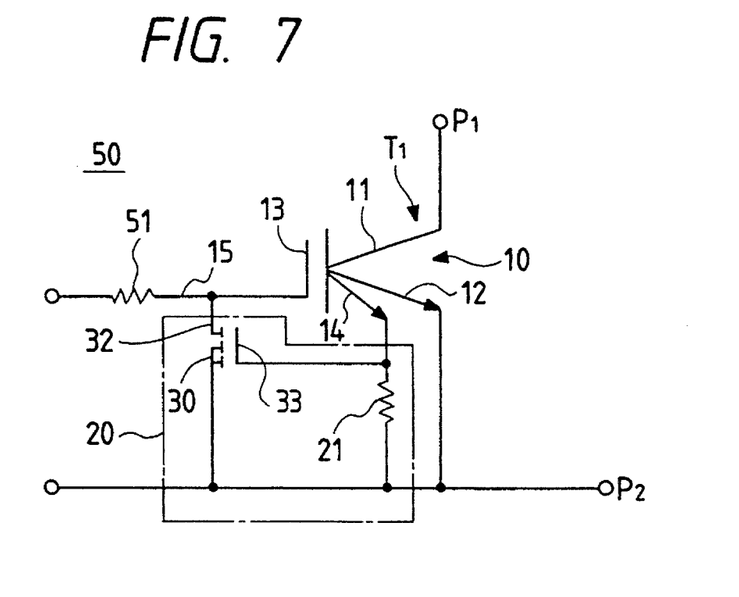
FIG. 7 is a circuit diagram showing a structure of a semiconductor device according to a sixth embodiment of the present invention.

FIG. 7 shows a circuit diagram of a structure of a semiconductor device according to a sixth embodiment of the present invention. As can be seen from FIG. 7, the present semiconductor device 50 has a structure which is substantially similar to that of the conventional semiconductor device. In particular, the device 50 consists mainly of a gate resistor 51, an IGBT 10 with a current sensing emitter 14 and a current limit circuit 20. What is worth notice in the sixth embodiment is that a threshold voltage $V_{th}$ of a MOSFET 30 is set equal to or less than a saturation voltage $V_{st}$ of a main insulated gate type switching element $T_1$ of the IGBT 10. The provision of such element characteristic makes it possible to protect the IGBT 10 from influences given by inductance components which are produced when a load circuit is shorted.

Figure 8A:
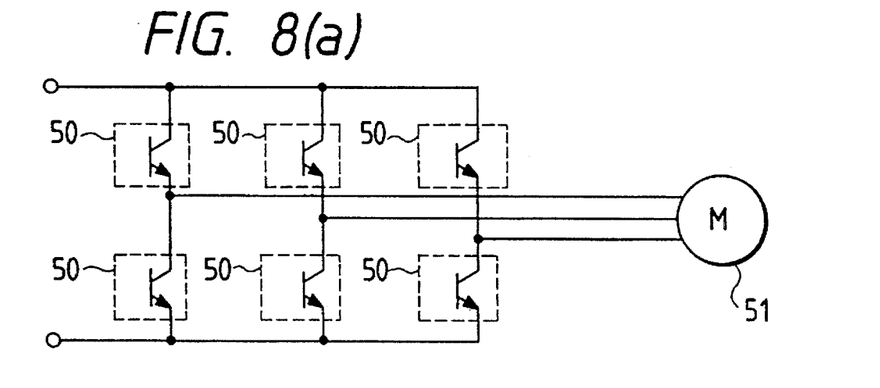
FIG. 8(a) is a circuit diagram showing an inverter circuit for a 3-phase motor using the semiconductor device shown in FIG. 7.
Figure 8B:
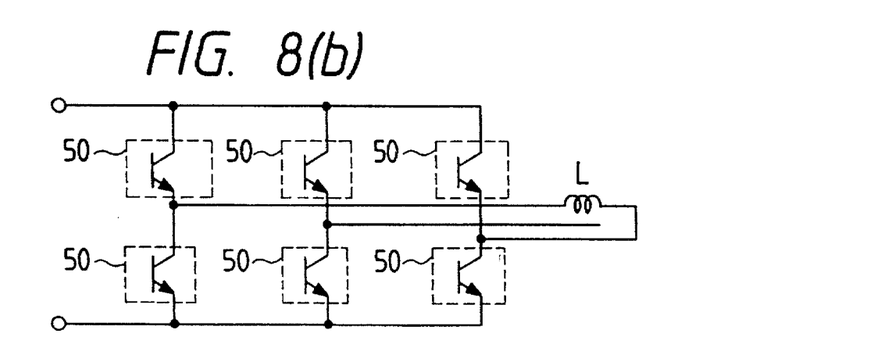
FIG. 8(b) is a circuit diagram of an equivalent circuit, illustrating the short state of the inverter circuit shown in FIG. 8(a)

FIG. 8(a) shows an inverter circuit which is used to drive a motor. Push-pull type semiconductor devices 50, 50 are connected to the respective phase of a three-phase motor 51. When a load short accident occurs in the inverter circuit, such accident can be expressed by an equivalent circuit shown in FIG. 8(b). That is, a plurality of semiconductor devices 50 are short-circuited through a wiring inductance L with respect to a power supply, thereby allowing a large current to flow. Since there is produced an induced voltage across the wiring inductance L until the current flowing in the wiring inductance L becomes saturated (reaches a constant value), a voltage applied to the semiconductor device 50 is maintained at a smaller level than the saturation voltage $V_{st}$ thereof. Generally, the threshold voltage $V_{th}$ of the MOSFET 30 is high, that is, 3–6V and, therefore, even when an overcurrent flows in the semiconductor device 50, the current limit circuit 20 will not be operated if the applied voltage is low. In view of this, in the illustrated embodiment, by setting the threshold voltage $V_{th}$ of the MOSFET 30 at a value equal to or smaller than the value of the saturation voltage $V_{st}$ of the IGBT 10, even if the voltage applied to the IGBT 10 in the beginning of the load short is small, the MOSFET 30 can be made to conduct. This can eliminate an unsensed time during the beginning of the short to thereby be able to protect the IGBT 10 effectively.

EMBODIMENT 7

Figure 9:
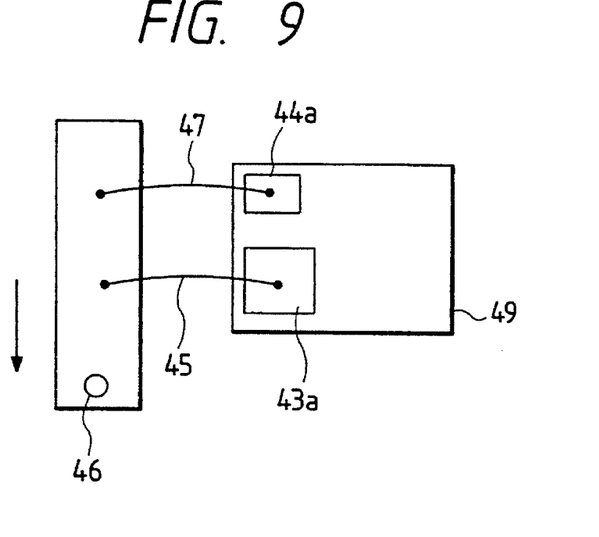
FIG. 9 is a circuit diagram showing a structure of a semiconductor device according to a seventh embodiment of the present invention.

FIG. 9 shows a plan view of a semiconductor device according to a seventh embodiment of the present invention when it is actually mounted. In this case, a semiconductor chip 49 includes therein an emitter pad 43a for a main insulated gate type switching element T₁ and an emitter pad 44a for a current detecting insulated gate type switching element T₂, which are provided independently of each other. The emitter pad 43a is connected through a wiring 45 to an externally extracting terminal 46, while the emitter pad 44a is connected through another wiring 47 to the externally extracting terminal 46. In the extracting terminal 46, a current flows in a direction of an arrow shown in FIG. 9 and the extracting terminal 46 also has a wide area.

Figure 10A:
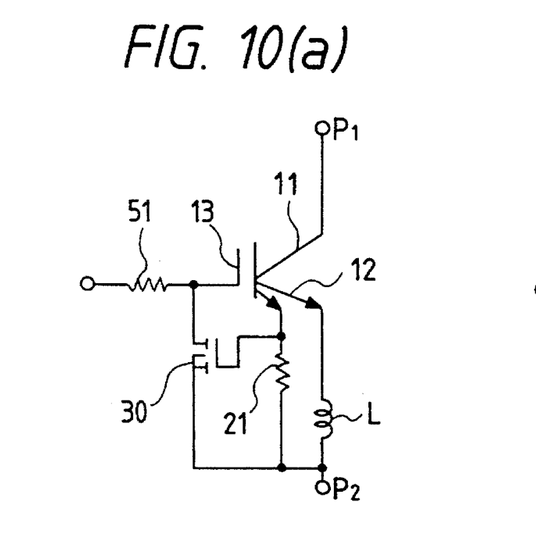
FIG. 10(a) is a circuit diagram of an equivalent circuit which shows the semiconductor device shown in FIG. 9.
Figure 10B:
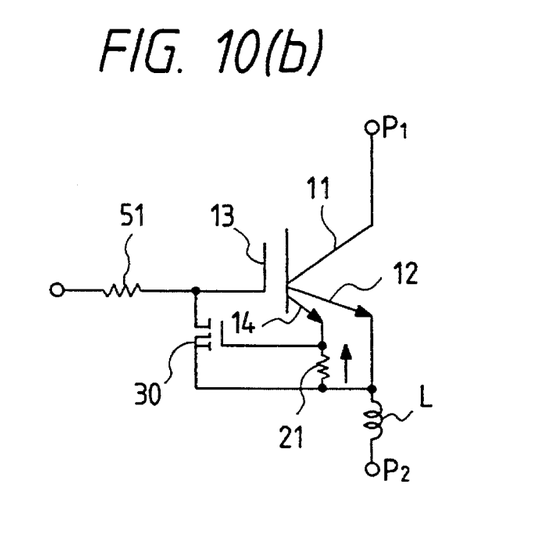
FIG. 10(b) is a circuit diagram of an equivalent circuit which shows a conventional semiconductor device.
Figure 11:
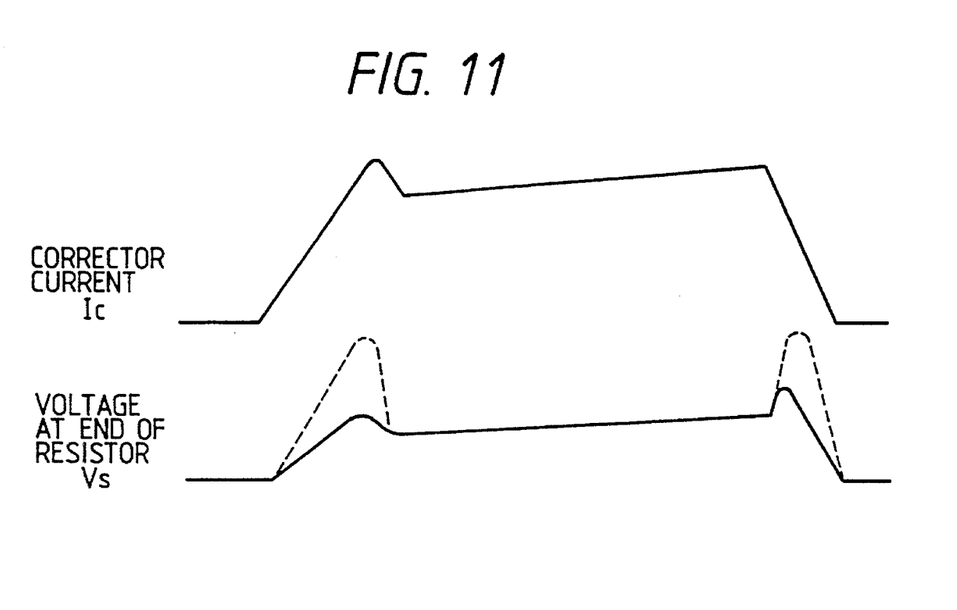
FIG. 11 is a graphical representation to explain an operation of the semiconductor device shown in FIG. 9.

Normally, a large current flows in the main insulated gate type switching element T₁ and, the higher the switching speed is, the more troublesome the inductance L of the wiring 45 is. As in FIG. 9, if the emitter pads 43a and 44a are not used in common but they are provided independently of each other and thus the two pads 43a and 44a are connected to the extracting terminal 46 by the separate wirings 45 and 47 respectively, then there can be obtained such an equivalent circuit as shown in FIG. 10(a). As can be seen clearly from FIG. 10(a), the inductance L of the wiring 45 is not included in a load circuit which includes the emitter pad 44a of the current detecting insulated gate type switching element T₂. On the other hand, when the emitter pads 43a and 44a are used in common, or when the emitter pad 43a is connected directly with the emitter pad 44a by means of a wiring, as shown in FIG. 10(b), the time differentiation (di/dt) of a current flowing in the main insulated gate type switching element T₂ and an induced voltage produced by the wiring inductance L are allowed to enter the load circuit of the current detecting insulated gate type switching element T₂. When the wiring inductance L is included in the current detecting insulated gate type switching element T₂, then the transient characteristic of the drop voltage (that is, resistor terminal voltage) of the current detect resistor 21 is so steep as shown by a broken line in FIG. 11. On the other hand, as in the present embodiment, when the wiring inductance L is not included in the current detecting insulated gate type switching element T₂, then the transient characteristic of the drop voltage $V_s$ is relieved. This delays the response speed of the IGBT 10, the gate voltage $V_g$ of which is controlled by the MOSFET 30, to thereby prevent the current sudden drop and the generation of the vibration of the current value, so as to be able to secure a stable current limit operation.

In the above-mentioned embodiments, description has been given of the semiconductor device which uses an IGBT as a switching element. However, as the switching element, there can be used other various kinds of insulated gate type switching elements such as a power MOSFET. Also, as a control element which bypass-controls the gate potential to drive these switching elements, instead of the MOSFET, it is also possible to use an insulated gate type element such as an IGBT. Further, as in the embodiment 1, when a relieving or easing resistance is inserted just before the switching element, it is of course possible to use an element such as a bipolar transistor or a thyristor, as a control element.

As has been described heretofore, according to the semiconductor device of the present invention, in a switching element which is able to perform a current limit operation, by relieving the change speed of the gate voltage thereof, the response speed of the limit operation is delayed to thereby restrict the generation of a voltage due to an inductance load which is caused to occur in resistance detect means. Therefore, a control element to control the gate voltage is prevented from conducting suddenly, which in turn prevents the sudden drop of a current or the vibration of the current value in the switching element. Thanks to this, the semiconductor device according to the present invention, including a semiconductor device which treats a large current, is able to secure a stable current limit operation and thus to surely prevent the element from being destroyed due to an overcurrent.

And, by setting the response speed of the switching element greater than the varying time of a main current to be treated by the present semiconductor device, it is possible to prevent a malfunction in which vibration of the main current is erroneously amplified or the main current is cut off by an instantaneous overcurrent. Therefor, by using the semiconductor device of the present invention, there can be realized a semiconductor device which has a stable protection function as well as a highly reliable switching function.

Also, due to the fact that, by inserting current limit means or current absorb means just before the gate electrode of the current detecting insulated gate type switching element, the response speed of the main insulated gate type switching element is equalized with that of the current detecting insulated gate type switching element, there are eliminated the possibilities that a sudden current limit occurs and also that the current detecting insulated gate type switching element itself is destroyed.

Further, when the threshold voltage of the gate controlling element is set equal to or smaller than the saturation voltage of the main insulated gate type switching element, then the gate controlling element can operate effectively even if a voltage to be applied to the main insulated gate type switching element is made low due to the induced voltage of a wiring inductance which is produced during the beginning of the load short. This makes it possible to protect the main switching element from an overcurrent.

In addition, when there is provided a commonly used an externally extracting terminal which is used to connect a terminal of the main insulated gate type switching element with a terminal of the resistor detecting means, the terminal of the main insulated gate type switching element is connected with the externally extracting terminal by means of a first wiring, and the terminal of the detection resistor means is connected with the externally extracting terminal by means of a second wiring, then a wiring inductance produced due to the first wiring on the side of the main insulated gate type switching element is not included in a load circuit provided on the side of the current detecting insulated gate type switching element. This prevents the transient voltage of the detecting resistor means from varying suddenly, which makes it possible to gently limit the current of the main insulated gate type switching element.

What is claimed is:

1. A semiconductor device, comprising:
    a main insulated gate type switching element having a gate electrode and controllable by a gate voltage applied to said gate electrode;
    a current detecting insulated gate type switching element connected in parallel to said main insulated gate type switching element;
    a detecting resistor means for detecting a current flowing in said current detecting insulated gate type switching element;

a gate controlling element for controlling said gate voltage by means of a drop voltage in said detecting resistor means, wherein a threshold voltage of said gate controlling element is set equal to or less than a saturation voltage of said main insulated gate type switching element; and a gate control relieving means for relieving a varying speed of said gate voltage varied based on an operation of said gate controlling element.

2. A semiconductor device as set forth in claim 1, wherein said gate control relieving means includes a current limit means coupled to said gate electrode for limiting the current through said main insulated gate type switching element.

3. A semiconductor device as set forth in claim 1, wherein said gate controlling element is an insulated gate type control element having an insulated gate, and said gate control relieving means includes a current limit means coupled to said insulated gate electrode of said insulated gate type control element for limiting a current of said insulated gate type control element.

4. A semiconductor device as set forth in claim 1, wherein said gate controlling element is an insulated gate type control element having an insulated gate, and said gate control relieving means is a current absorb means coupled to said gate electrode of said insulated gate type control element for limiting a current through said insulated gate type control element.

5. A semiconductor device as set forth in claim 1, 2, 3 or 4, wherein said main insulated gate type switching element and said current detecting insulated gate type switching element are an IGBT having a current sensing terminal.

6. A semiconductor device, comprising:

a main insulated gate type switching element having a gate electrode and controllable by a gate voltage applied to said gate electrode;

a current detecting insulated gate type switching element connected in parallel to said main insulated gate type switching element;

a detecting resistor means for detecting a current flowing in said current detecting insulated gate type switching element; and a gate controlling element for controlling said gate voltage by means of a drop voltage in said detecting resistor means, wherein a threshold voltage of said gate controlling element is set equal to or less than a saturation voltage of said main insulated gate type switching element.

7. A semiconductor device comprising:

a main insulated gate type switching element having a gate electrode and controllable by a gate voltage applied to said gate electrode;

a current detecting insulated gate type switching element connected in parallel to said main insulated gate type switching element, said main insulated gate type switching element and said current detecting insulated gate type switching element being formed on a single semiconductor chip;

a detecting resistor means for detecting a current flowing in said current detecting insulated gate type switching element;

a gate controlling element for controlling said gate voltage by means of a drop voltage in said detecting resistor means; and a commonly used and externally extracting terminal for connecting a terminal of said main insulated gate type switching element with a terminal of said detecting resistor means, said externally extracting terminal having an end portion through which an electrical current flows, wherein said terminal of said main insulated gate type switching element is connected with said externally extracting terminal by means of a first wiring connected to a first portion of said extracting terminal, and said terminal of said detecting resistor means is connected with said externally extracting terminal by means of a second wiring connected to a second portion of said extracting terminal, said first portion being located between said second portion and said end portion of said extracting terminal.

8. A semiconductor device, comprising:

a main insulated gate type switching element having a gate electrode and controllable by a gate voltage applied to said gate electrode;

a current detecting insulated gate type switching element connected in parallel to said main insulated gate type switching element;

a first current limit means coupled to a gate electrode of said current detecting insulated gate type switching element for limiting the gate current thereof only;

a detecting resistor means for detecting a current flowing in said current detecting insulated gate type switching element;

a gate controlling element for controlling said gate voltage by means of a drop voltage in said detecting resistor means; and a gate control relieving means for relieving a varying speed of said gate voltage varied based on an operation of said gate controlling element.

9. A semiconductor device as set forth in claim 8, wherein said gate control relieving means includes a second current limit means coupled to said gate electrode for limiting a current of said main insulated gate type switching element.

10. A semiconductor device as set forth in claim 8, wherein said gate controlling element includes an insulated gate type control element having an insulated gate, and said gate control relieving means includes a second current limit means coupled to said gate electrode of said insulated gate type control element for limiting a current of said insulated gate type control element.

11. A semiconductor device as set forth in claim 8, wherein said gate controlling element is an insulated gate type control element having an insulated gate, and said gate control relieving means is a current absorb means coupled to said gate electrode of said insulated gate type control element for limiting a current of said insulated gate type control element.

12. A semiconductor device, comprising:

a main insulated gate type switching element having a gate electrode and controllable by a gate voltage applied to said gate electrode;

a current detecting insulated gate type switching element connected in parallel to said main insulated gate type switching element;

a current absorb means coupled to a gate electrode of said current detecting insulated gate type switching element for limiting a gate current thereof;

a detecting resistor means for detecting a current flowing in said current detecting insulated gate type switching element;

a gate controlling element for controlling said gate voltage by means of a drop voltage in said detecting resistor means; and a gate control relieving means for relieving a varying speed of said gate voltage varied based on an operation of said gate controlling element.

13. A semiconductor device as set forth in claim 12, wherein said gate control relieving means includes a current limit means coupled to said gate electrode for further limiting said gate current.

14. A semiconductor device as set forth in claim 12, wherein said gate controlling element includes an insulated gate type control element having an insulated gate, and said gate control relieving means includes a current limit means coupled to said gate electrode of said insulated gate type control element for limiting a current through said insulated gate type control element.

15. A semiconductor device as set forth in claim 12, wherein said gate controlling element is an insulated gate type control element having an insulated gate, and said gate control relieving means includes a current absorb means coupled to said gate electrode of said insulated gate type control element for limiting a current through said insulated gate type control element.

* * * * *